(12) United States Patent
Wang et al.

(10) Patent No.: US 11,587,718 B2
(45) Date of Patent: Feb. 21, 2023

(54) INTEGRATED TRANSFORMER AND POWER CONVERTER

(71) Applicant: Delta Electronics (Shanghai) Co., Ltd., Shanghai (CN)

(72) Inventors: Baohua Wang, Shanghai (CN); Tengfei Yang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 265 days.

(21) Appl. No.: 17/125,950

(22) Filed: Dec. 17, 2020

(65) Prior Publication Data
US 2021/0193366 A1    Jun. 24, 2021

(30) Foreign Application Priority Data

Dec. 20, 2019    (CN) .......................... 201911323200.X

(51) Int. Cl.
*H01F 27/28* (2006.01)
*H02M 3/335* (2006.01)
*H05K 1/18* (2006.01)
*H01F 27/24* (2006.01)

(52) U.S. Cl.
CPC ............. *H01F 27/28* (2013.01); *H01F 27/24* (2013.01); *H02M 3/33576* (2013.01); *H05K 1/18* (2013.01); *H05K 2201/1003* (2013.01)

(58) Field of Classification Search
CPC .... H01F 27/28; H01F 27/24; H02M 3/33576; H05K 1/18; H05K 2201/1003
See application file for complete search history.

(56) References Cited

U.S. PATENT DOCUMENTS

| 11,417,456 B2* | 8/2022 | Zhang | H01F 27/36 |
| 11,417,458 B2* | 8/2022 | Lu | H01F 27/29 |
| 2022/0172880 A1* | 6/2022 | Khaligh | H05K 1/165 |

FOREIGN PATENT DOCUMENTS

| CN | 101017730 A | 8/2007 |
| CN | 201369232 Y | 12/2009 |
| CN | 206225165 U | 6/2017 |

(Continued)

OTHER PUBLICATIONS

Corresponding China office action dated Jun. 2, 2022 with English translation.
Corresponding China office action dated Nov. 2, 2021.

*Primary Examiner* — Adolf D Berhane
(74) *Attorney, Agent, or Firm* — CKC & Partners Co., LLC

(57) ABSTRACT

This disclosure provides an integrated transformer and a power converter, the integrated transformer includes: a magnetic core, including an upper cover, a lower cover, a first winding column and a second winding column; a printed wiring board, disposed between the upper cover and the lower cover, and including a first through hole corresponding to the first winding column and a second through hole corresponding to the second winding column; and a first winding, a second winding, a third winding and a fourth winding; the first winding and the third winding are wound on the first winding column and the second winding column respectively, the second winding and the fourth winding are provided at positions corresponding to the first through hole and the second through hole on the printed wiring board, and magnetic flux directions within the first winding column and the second winding column are opposite.

20 Claims, 4 Drawing Sheets

(56) References Cited

FOREIGN PATENT DOCUMENTS

| | | |
|---|---|---|
| CN | 206225187 U | 6/2017 |
| CN | 106998142 A | 8/2017 |
| CN | 108400719 A | 8/2018 |
| CN | 208690073 U | 4/2019 |
| CN | 208861785 U | 5/2019 |
| JP | 2009170804 A | 7/2009 |
| JP | 2014204032 A | 10/2014 |
| WO | 0191142 A1 | 11/2001 |

* cited by examiner

INTEGRATED TRANSFORMER AND POWER CONVERTER

CROSS-REFERENCE TO RELATED APPLICATION

This application claims priority to Chinese Patent Application No. 201911323200.X, filed on Dec. 20, 2019, which is hereby incorporated by reference in its entirety.

TECHNICAL FIELD

The present disclosure relates to the technical field of power electronics, and in particular, to an integrated transformer and a power converter.

BACKGROUND

Transformer is a device which is used to increase or decrease the output voltage, or is only used to insulate the input voltage and the output voltage in the circuit. Conventional transformers usually include a magnetic core, a bobbin, a coil, and a tape. Transformers of this structure are bulky, complicated to make, and poor in consistency. Moreover, the distance from the secondary coil of the transformer to the secondary-side power devices cannot be made very small, so an alternating-current (AC) loss is large, and it is difficult to meet the requirement of high frequency and high efficiency.

Another type of transformer adopts a planar transformer structure in which both the primary and the secondary coils are disposed on a printed wiring board (PWB). Transformers of this structure are small in size and easy to make. However, when the number of coil turns is large or the current flowing through the coil is large, the number of the PWB layers increases significantly, resulting in complicated design and high costs. Besides, when insulating strength is high, this planar transformer structure can hardly meet the design requirement on the insulation withstand voltage between the primary and secondary sides of 5 KVac or higher.

In view of the above, it is difficult to increase the insulation withstand voltage and the power efficiency while reduce the overall volume of above two types of transformers. However, as the requirement on the volume, withstand voltage level, and efficiency of power converters become higher and higher in medical, industrial and other technical fields, it is more and more important to optimize structure and performance of the transformer which serves as an important component of the power converters.

SUMMARY

The present disclosure relates to an integrated transformer and a power converter, to increase an insulation withstand voltage and power efficiency of a transformer while reducing an overall volume of the transformer.

In a first aspect, the present disclosure provides an integrated transformer, including:

a magnetic core, including an upper cover, a lower cover, a first winding column and a second winding column, where the first winding column and the second winding column are disposed adjacently and are located between the upper cover and the lower cover;

a printed wiring board, disposed between the upper cover and the lower cover, where the printed wiring board includes a first through hole and a second through hole, the first through hole corresponds to the first winding column, and the second through hole corresponds to the second winding column;

a first winding, wound on the first winding column;

a second winding, provided in the printed wiring board and corresponding to the first through hole;

a third winding, wound on the second winding column; and a fourth winding, provided in the printed wiring board and corresponding to the second through hole, where magnetic flux directions inside the first winding column and the second winding column are opposite.

Another aspect of the present disclosure provides a power converter, including:

a magnetic component, including a primary winding and a secondary winding;

a primary circuit, electrically connected to the primary winding of the magnetic component; and a secondary circuit, electrically connected to the secondary winding of the magnetic component, where the magnetic component is configured as the integrated transformer as described above, the first winding and the third winding form the primary winding of the magnetic component, and the second winding and the fourth winding form the secondary winding of the magnetic component.

BRIEF DESCRIPTION OF THE DRAWINGS

The drawings herein are incorporated in the present specification and constitute a part of the present specification, and the embodiments consistent with the present disclosure are illustrated and together with the description serve to explain the principles of the present disclosure.

Through the above drawings, embodiments of the present disclosure have been clearly shown, which will be described in more detail later. These drawings and text descriptions are not intended to limit the scope of the concept of the present disclosure in any way, but rather to explain the concept of the present disclosure to those skilled in the art by referring to specific embodiments.

DESCRIPTION OF EMBODIMENTS

Illustrative embodiments will be described in detail herein, examples of which are illustrated in the accompanying drawings. When the following description refers to the accompanying drawings, the same numbers in different drawings represent the same or similar elements unless otherwise indicated. The implementations described in the following exemplary embodiments do not represent all implementations consistent with the present disclosure. Rather, they are merely examples of devices and methods consistent with some aspects of the present disclosure, as detailed in the appended claims.

The power converter is a device that converts the power provided by an external power source and transmits the converted voltage and current to a load, thereby satisfying different voltage and current requirements of various loads. The transformer is one of the important components in the power converter. On the one hand, a primary voltage can be converted into a secondary voltage according to a certain transformation ratio. On the other hand, the primary and the secondary can be isolated from each other.

Figure 1:
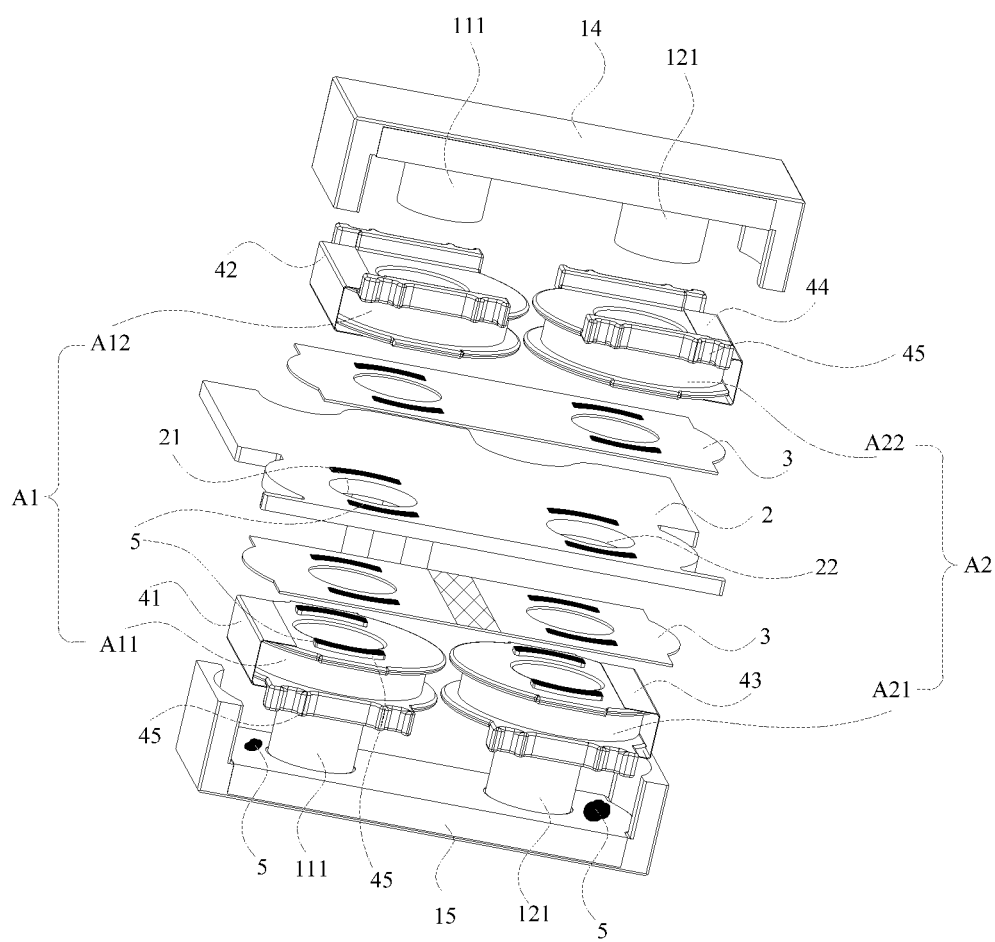
FIG. 1 is an exploded view of an integrated transformer provided according to an embodiment of the present disclosure.
Figure 2:
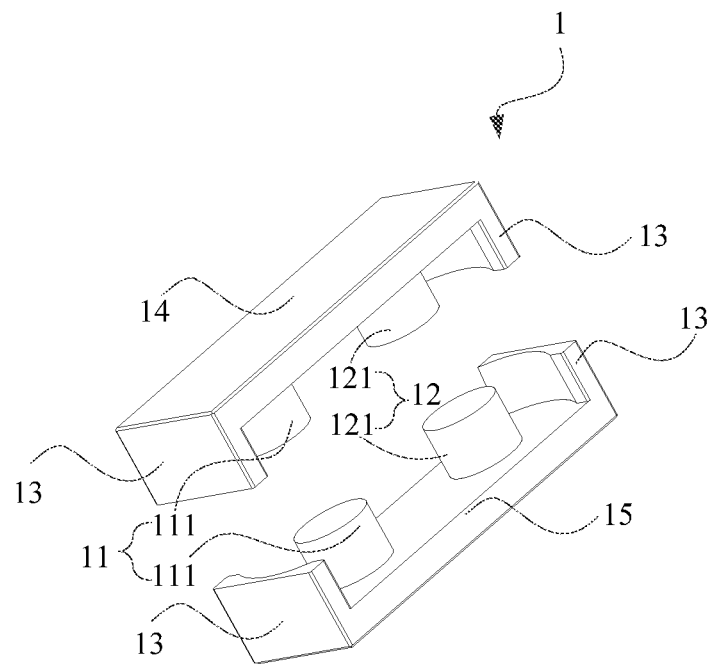
FIG. 2 is a schematic structural diagram of a magnetic core in the integrated transformer provided according to an embodiment of the present disclosure.
Figure 3:
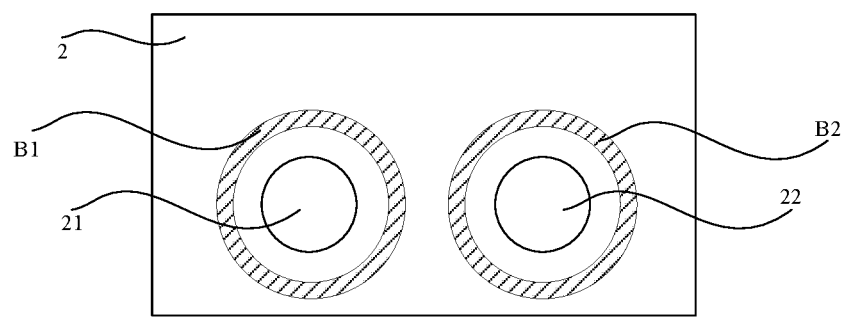
FIG. 3 is a sectional view of a PWB in the integrated transformer provided according to an embodiment of the present disclosure.

FIG. 1 is an exploded view of an integrated transformer provided according to an embodiment of the present disclosure, FIG. 2 is a schematic structural diagram of a magnetic core in the integrated transformer provided according to an embodiment of the present disclosure, and FIG. 3 is a sectional view of a PWB in the integrated transformer provided according to an embodiment of the present disclosure. Referring to FIG. 1 to FIG. 3, embodiments of the present disclosure provides an integrated transformer, which can integrate at least two transformers. The integrated transformer includes a magnetic core 1, a first winding A1, a second winding B1, a third winding A2, a fourth winding B2 and a printed wiring board (PWB) 2; where the magnetic core 1 includes an upper cover 14, a lower cover 15, a first winding column 11 and a second winding column 12, where the first winding column 11 and the second winding column 12 are disposed adjacently, and the first winding column 11 and the second winding column 12 are located between the upper cover 14 and the lower cover 15. The PWB 2 is disposed between the upper cover 14 and the lower cover 15, and the PWB 2 further includes a first through hole 21 corresponding to the first winding column 11, and a second through hole 22 corresponding to the second winding column 12. The first winding A1 is wound on the first winding column 11, the third winding A2 is wound on the second winding column 12, the second winding B1 and the fourth winding B2 are disposed at positions corresponding to the first through hole 21 and the second through hole 22 on the PWB 2 respectively, and magnetic flux directions inside the first winding column 11 and the second winding column 12 are opposite.

It is worth noting that, in some examples, as shown in FIG. 2, the magnetic core 1 may be formed by two magnetic sub-cores that have the same structure and are disposed oppositely, and each of the magnetic sub-cores includes a connection portion and two side columns 13 provided at both ends of the connection portion. The respective connection portions of the two magnetic sub-cores form the upper cover 14 and the lower cover 15 of the magnetic core 1, respectively; and each of the magnetic sub-cores further includes a first sub-winding column 111 and a second sub-winding column 121 adjacently disposed on the cover. The two first sub-winding columns 111 are oppositely disposed to form the first winding column 11, and the two second sub-winding columns 121 are oppositely disposed to form the second winding column 12. The first winding column 11 and the second winding column 12 are located between the upper cover 14 and lower cover 15; where the first winding column 11 and the second winding column 12 are disposed at a middle part of the upper cover 14 or the lower cover 15 symmetrically to the center, and are located between the two side columns 13. In other examples, the magnetic core 1 may also be composed of one magnetic sub-core as shown in FIG. 2 and one cover, and in this case, the first sub-winding column 111 is the first winding column 11, the second sub-winding column 121 is the second winding column 12, the first winding column 11 and the second winding column 12 are located between the upper cover 14 and the lower cover 15. Therefore, the shape of the magnetic core 1 can be variously modified, which is not limited in the present disclosure.

As shown in FIGS. 1 and 3, in the present embodiment, the first through hole 21 and the second through hole 22 are disposed on the PWB 2, the second winding B1 is provided in the PWB 2 and corresponds to the first through hole 21, and the fourth winding B2 is provided in the PWB 2 and corresponds to the second through hole 22. And the first through hole 21 corresponds to the first winding column 11, that is, the first winding column 11 can pass through the first through hole 21; and the second through hole 22 corresponds to the second winding column 12, that is, the second winding column 12 can pass through the second through hole 22. More specifically, the first winding column 11 passes through the centers of the first winding A1 and the second winding B1, so that both the first winding A1 and the second winding B1 surround the first winding column 11. The second winding column 12 passes through the centers of the third winding A2 and the fourth winding B2, so that both the third winding A2 and the fourth winding B2 surround the second winding column 12.

The first winding A1 and the third winding A2 may be wound on the first winding column 11 and the second winding column 12 respectively in the form of a continuous wire, and the winding directions of the two are opposite. Similarly, the winding directions of the second winding B1 and the fourth winding B2 are also opposite, so that the magnetic flux direction inside the first winding column 11 is opposite to the magnetic flux direction inside the second winding column 12. In this way, when the two transformers are integrated, some side columns may be omitted (for example, four side columns may be changed to only two side columns), so that the volume of the magnetic core 1 of the two transformers being integrated can be significantly reduced, and the magnetic core loss can be effectively reduced. The second winding B1 and the fourth winding B2 are disposed in the PWB 2, which can further reduce the overall volume of the integrated transformer. In some embodiments, the first winding A1 and the third winding A2 are configured as the primary windings of the integrated transformer, and the second winding B1 and the fourth winding B2 are configured as the secondary windings of the integrated transformer. While in some other embodiments, the first winding A1 and the third winding A2 are configured as the secondary windings of the integrated transformer, and the second winding B1 and the fourth winding B2 are configured as the primary windings of the integrated transformer, which is not limited in the present disclosure. In this embodiment, the first winding A1 and the second winding B1 are configured as the primary and the secondary windings of a first transformer T1, and the third winding A2 and the fourth winding B2 are configured as the primary and the secondary windings of a second transformer T2.

The shapes of the first winding column 11 and the second winding column 12 may be cylindrical or other shapes, such as a polygon, a track shape, an ellipse, and the like, which is not limited in the present disclosure.

In addition, the inner surfaces of the side columns 13 can also be set to a shape corresponding to the outer contours of the first winding column 11 and the second winding column 12. For example, when the first winding column 11 and the second winding column 12 are cylindrical, the inner surface of the side columns 13 may be set as an arc-shaped concave corresponding to the cylindrical shape.

In the integrated transformer provided by the embodiment of the present disclosure, the first winding A1 of the first transformer T1 and the third winding A2 of the second transformer T2 are respectively wound on the first winding column 11 and the second winding column 12 that are disposed adjacently, the second winding B1 of the first transformer T1 and the fourth winding B2 of the second transformer T2 are respectively provided at corresponding positions on the PWB 2, and the winding directions of all the windings are reasonably designed, to ensure that the magnetic flux directions inside the first winding column 11 and the second winding column 12 are opposite, so that the two transformers are integrated into one magnetic element, thereby achieving an increase in the insulation withstand voltage and the power efficiency while reducing the overall volume of the transformer.

It is worth noting that although FIG. 1 and FIG. 2 only show an embodiment in which two transformers are integrated, those skilled in the art can easily extend it to the integration of more than two transformers according to the technical solution disclosed by the present disclosure. Therefore, the number of transformers that can be integrated may be two or more, which is not limited in the present disclosure.

Figure 4:
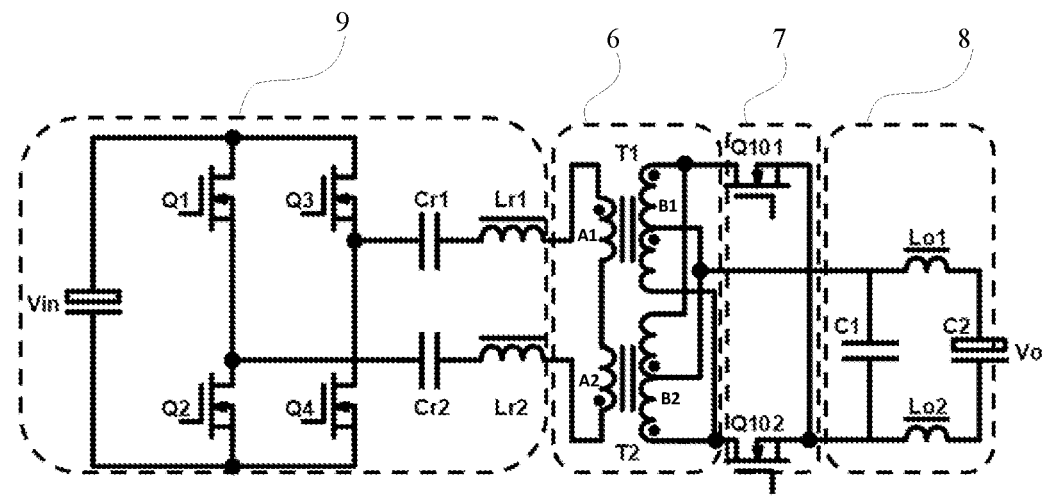
FIG. 4 is a circuit schematic diagram of a power converter provided according to an embodiment of the present disclosure.
Figure 5:
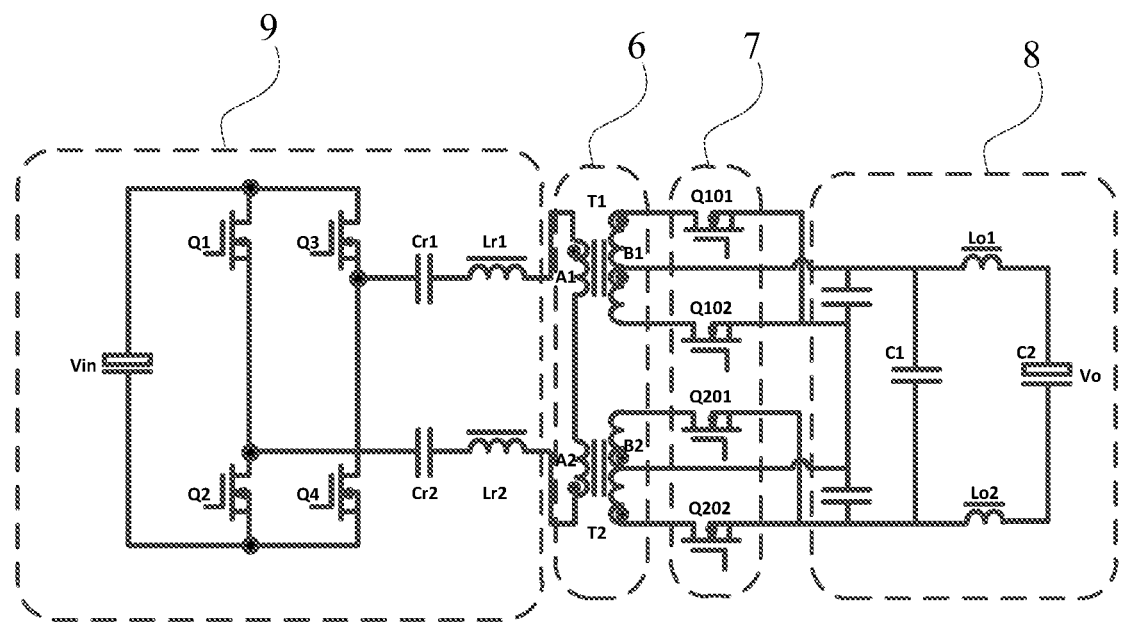
FIG. 5 is a circuit schematic diagram of a power converter provided according to another embodiment of the present disclosure.

FIG. 4 is a circuit schematic diagram of the power converter provided according to an embodiment of the present disclosure, and FIG. 5 is a circuit schematic diagram of the power converter provided according to another embodiment of the present disclosure. As shown in FIG. 4 and FIG. 5, in some embodiments, the first winding A1 and the third winding A2 may be electrically connected in series, and the second winding B1 and the fourth winding B2 may be electrically connected in parallel. In some other embodiments, the first winding A1 and the third winding A2 may be electrically connected in series, and the second winding B1 and the fourth winding B2 may be electrically connected in series. In this way, the two transformers can be connected together to realize voltage conversion.

It can be understood that the first winding A1 and the third winding A2 may be connected in series directly or indirectly; and the second winding B1 and the fourth winding B2 may be connected in series directly or indirectly, or may be connected in parallel directly or indirectly. The present disclosure does not limit thereto.

In some other embodiments, as shown in FIG. 1, the first winding A1 includes a first sub-winding A11 and a second sub-winding A12, and the first sub-winding A11 and the second sub-winding A12 are located on two sides of a plane where the PWB 2 is located, respectively; and the third winding A2 includes a third sub-winding A21 and a fourth sub-winding A22, and the third sub-winding A21 and the fourth sub-winding A22 are located on two sides of the plane where the PWB 2 is located, respectively, which can effectively reduce leakage inductance.

For example, the first sub-winding A11 and the third sub-winding A21 may be located on one side of the plane where the PWB 2 is located, and the second sub-winding A12 and the fourth sub-winding A22 may be located on the other side of the plane where the PWB 2 is located.

In some embodiments, the first sub-winding A11 and the second sub-winding A12 may be connected in series or in parallel. Further, the first sub-winding A11 and the second sub-winding A12 may be connected in series directly or indirectly, or may be connected in parallel directly or indirectly. The present disclosure does not put a limitation on this.

In some other embodiments, the third sub-winding A21 and the fourth sub-winding A22 may be connected in series or in parallel. Further, the third sub-winding A21 and the fourth sub-winding A22 may be connected in series directly or indirectly, or may be connected in parallel directly or indirectly. The present disclosure does not put a limitation on this.

In some embodiments, the first sub-winding A11 and the third sub-winding A21 are wound on the first winding column 11 and the second winding column 12 using a same winding wire (that is, a continuous winding wire), and winding directions of the first sub-winding A11 and the third sub-winding A21 are opposite, so as to ensure that the magnetic flux directions of the first winding column 11 and second winding column 12 are opposite, which is beneficial to reduce the volume of the integrated transformer and reduce the number of connecting pins. Similarly, the second sub-winding A12 and the fourth sub-winding A22 may also be continuously wound on the first winding column 11 and the second winding column 12 in the form of a continuous wire, and the winding directions of the second sub-winding A12 and the fourth sub-winding A22 are opposite.

In addition, as shown in FIG. 1, the two magnetic sub-cores of the magnetic core 1 are located on two sides of the PWB 2, respectively, the first sub-winding A11 is wound on a corresponding first sub-winding column 111 of one magnetic sub-core, and the second sub-winding A12 is wound on a corresponding first sub-winding column 111 of the other magnetic sub-core. Similarly, the third sub-winding A21 is wound on a corresponding second sub-winding column 121 of one magnetic sub-core, and the fourth sub-winding A22 is wound on a corresponding second sub-winding column 121 of the other magnetic sub-core. In this way, the first sub-winding A11 and the third sub-winding A21 are disposed on two sub-winding columns of one same magnetic sub-core, and the second sub-winding A12 and the fourth sub-winding A22 are disposed on two sub-winding columns of the other magnetic sub-core, and are located on two sides of the PWB 2, respectively. The second winding B1 and the fourth winding B2 are disposed on the PWB 2, so that the first transformer T1 and the second transformer T2 are integrated on one magnetic element, which is beneficial to reduce the volume of the integrated transformer and increase the insulation withstand voltage; and the first sub-winding A11 and the second sub-winding A12 sandwich the second winding B1, and the third sub-winding A21 and the fourth sub-winding A22 sandwich the fourth winding B2 to form a sandwich structure, which can further reduce leakage inductance.

Further, the integrated transformer may further include a first bobbin 41, a second bobbin 42, a third bobbin 43 and a fourth bobbin 44, where the first bobbin 41 and the second bobbin 42 are respectively assembled on the two opposite first sub-winding columns 111, the third bobbin 43 and the fourth bobbin 44 are respectively assembled on the two opposite second sub-winding columns 121, the first sub-winding A11 is wound on the first bobbin 41, the second sub-winding A12 is wound on the second bobbin 42, the third sub-winding A21 is wound on the third bobbin 43, and the fourth sub-winding A22 is wound on the fourth bobbin 44. By setting the bobbins on the winding columns, winding process is more convenient and the operation difficulty of winding is reduced.

When winding, the winding directions of the first sub-winding A11 and the third sub-winding A21 are opposite, the winding directions of the second sub-winding A12 and the fourth sub-winding A22 are opposite. Moreover, the first sub-winding A11, the second sub-winding A12 and the second winding B1 have the same winding direction, and the third sub-winding A21, the fourth sub-winding A22 and the fourth winding B2 have the same winding direction, so that magnetic flux directions inside the first winding column 11 and the second winding column 12 are opposite, which can effectively reduce the volume of the magnetic core of the integrated transformer, thereby effectively reducing the magnetic core loss.

In addition, the first sub-winding A11 and the third sub-winding A21 may be wound on the first bobbin 41 and the third bobbin 43 respectively in the form of a continuous wire, and the second sub-winding A12 and the fourth sub-winding A22 also may be wound on the second bobbin 42 and the fourth bobbin 44 respectively in the form of a continuous wire. In this way, one pin can be reduced from the pins of the integrated transformer.

In some embodiments, the bobbins may be cylindrical, and have a magnetic core hole. When the bobbin is assembled on a winding column, the winding column is located in the magnetic core hole. The bobbins are provided with a winding slot outside to provide space for the windings of the transformer. The bobbins are also generally provided with metal pins, which are used to wound by the windings of the transformer. The metal pins are connected to the PWB 2 by welding, and can play a conductive role when the transformer is working. A retaining wall 45 may also be provided on the bottom of the bobbins, which is more useful to fix the relative position between the bobbins and the PWB 2, and providing a certain distance between tin piles generated during tin soldering and the PWB 2, and between the magnetic core and the PWB 2, so as to isolate the magnetic core from the tin piles and avoid the occurrence of poor withstand voltage.

It should be understood that the first bobbin, the second bobbin, the third bobbin and the fourth bobbin in the embodiments of the present disclosure may adopt any existing bobbin according to actual needs, as long as the integrated transformer can work normally. The present disclosure does not put a limitation on it.

Further, a heat dissipation gap may be provided between each bobbin and the magnetic core 1, and between each bobbin and the PWB 2, so that the integrated transformer dissipates heat faster.

It is easy to understand that the size of the above heat dissipation gap can be selected according to an actual situation. Generally, the heat dissipation capacity and the volume of the transformer can be considered comprehensively in the design, so as to select an optimal size of the heat dissipation gap to balance the relationship between heat dissipation capacity and the volume.

Specifically, in order to form the above heat dissipation gaps, a certain number of bumps 5 may be provided on the first bobbin 41, the second bobbin 42, the third bobbin 43 and the fourth bobbin 44. The bumps 5 can ensure the heat dissipation gap between each bobbin and the magnetic core 1, and the heat dissipation gap between each bobbin and the PWB 2. The bumps 5 may be provided on top and bottom surfaces of each bobbin.

Similarly, the bumps 5 may also be provided on the magnetic core 1 or on the PWB 2. For example, a certain number of bumps 5 are provided on inner surfaces of the upper cover 14 and the lower cover 15 and/or top and bottom surfaces of the PWB 2, which can also ensure the heat dissipation gaps between each bobbin and the magnetic core 1 and between each bobbin and the PWB 2. The present disclosure does not put a limitation on this.

It should be understood that, in addition to providing the bumps 5, those skilled in the art may also use other methods to space each bobbin from the magnetic core 1 and the PWB 2. For example, brackets are provided between each bobbin and the magnetic core 1, and between each bobbin and the PWB 2 to ensure that there are certain heat dissipation gaps between each bobbin and the magnetic core 1 and between each bobbin and the PWB 2, thereby optimizing heat dissipation conditions, which is not limited in the present disclosure.

In some embodiments, as shown in FIG. 1, according to a safety requirement, an insulating sheet 3 may be provided between the first winding A1 and the PWB 2 and provide between the third winding A2 and the PWB 2, that is, the first winding A1 and the second winding B1, and the third winding A2 and the fourth winding B2 are separated by the insulating sheets 3, thereby increasing the insulation voltage between the first winding A1 and the second winding B1 and the insulation voltage between the third winding A2 and the fourth winding B2, to meet a requirement on insulation withstand voltage between the primary and the secondary sides of the first transformer T1 and the second transformer T2. In some other embodiments, the insulation voltage between the primary and the secondary sides can also be increased by increasing a distance between the primary and the secondary windings to meet a requirement on the insulation withstand voltage of the transformer, that is, the PWB 2 is maintained as a certain distance from the first winding A1 and the third winding A2. In some other embodiments, a cable with a higher insulation strength may be adopted for the first winding A1 and the third winding A2 to meet the requirement on the insulation withstand voltage between the primary and the secondary sides. Of course, the above examples are not intended to put specific limitations on the present disclosure.

In an preferred embodiment, a circuit module electrically connected to the second winding B1 and the fourth winding B2 is also integrated on the PWB 2, where the circuit module includes a rectifying unit 7 and/or a filtering unit 8. The rectifying unit 7 is configured to convert an AC voltage into a DC voltage, and the filtering unit 8 is configured to reduce output voltage ripples or current ripples. It should be understood that, in the present example, the rectifying unit 7 and the filtering unit 8 may be constituted by any suitable circuit in the prior art.

Specifically, as shown in FIG. 4, the power converter includes a main power transformer 6, the rectifying unit 7 and the filtering unit 8, where the main power transformer 6 is the integrated transformer provided by an embodiment of the present disclosure, which specifically includes a first transformer T1 and a second transformer T2. The first transformer T1 and the second transformer T2 are integrated on a magnetic element, the primary windings of the first transformer T1 and the second transformer T2 (that is, the first winding A1 and the third winding A2) use triple insulated wires to increase the insulation withstand voltage. The secondary windings of the first transformer T1 and the second transformer T2 (that is, the second winding B1 and the fourth winding B2) are printed on the PWB 2, and the secondary windings of the first transformer T1 and the second transformer T2 are both center tapped structure, that is, each of the secondary windings of the first transformer T1 and the second transformer T2 includes a first end, a second end, and a tapped end. The rectifying unit 7 includes switches Q101 and Q102. One end of the switch Q101 is electrically connected to both a first end of the second winding B1 and a first end of the fourth winding B2 at the same time. One end of the switch Q102 is electrically connected to both a second end of the second winding B1 and a second end of the fourth winding B2. The other end of the switch Q101 is electrically connected to the other end of the switch Q102 and one end of the filtering unit 8. The tapped end of the second winding B1 is electrically connected to the tapped end of the fourth winding B2 and the other end of the filtering unit 8. The specific connection manner can be seen in FIG. 4. The filtering unit 8 includes an inductor Lo1, an inductor Lo2, a capacitor C1, and a capacitor C2, and the specific connection manner can be seen in FIG. 4.

It should be understood that FIG. 4 only shows a feasible connection manner. During actual use, a person skilled in the art may change this according to needs to meet specific requirements. Another circuit structure can be seen in FIG. 5, where the secondary windings of the first transformer T1 and the second transformer T2 are respectively connected to a rectifier circuit, and the outputs of the two rectifier circuits are electrically connected in series. In the present disclosure, the connection manner among the main power transformer 6, the rectifying unit 7 and filtering unit 8 is not limited.

In some examples, both the rectifying unit 7 and the filtering unit 8 may be integrated on the PWB 2 to reduce an overall volume of the power converter, shorten connection cables, and reduce cable loss. In addition, the filtering unit 8 may also be directly integrated at an output end of the integrated transformer, for example, arranged on a connection pin (i.e. Pin) of the PWB 2 to a system power board (not shown in the figure) to further reduce the volume of the entire power converter. Specifically, the PWB 2 in the integrated transformer and the system power board may be separately configured PWBs or an integrated PWB.

In addition, in some embodiments, the PWB 2 of the integrated transformer may only integrate the rectifying unit 7, but not the filtering unit 8.

Figure 6:
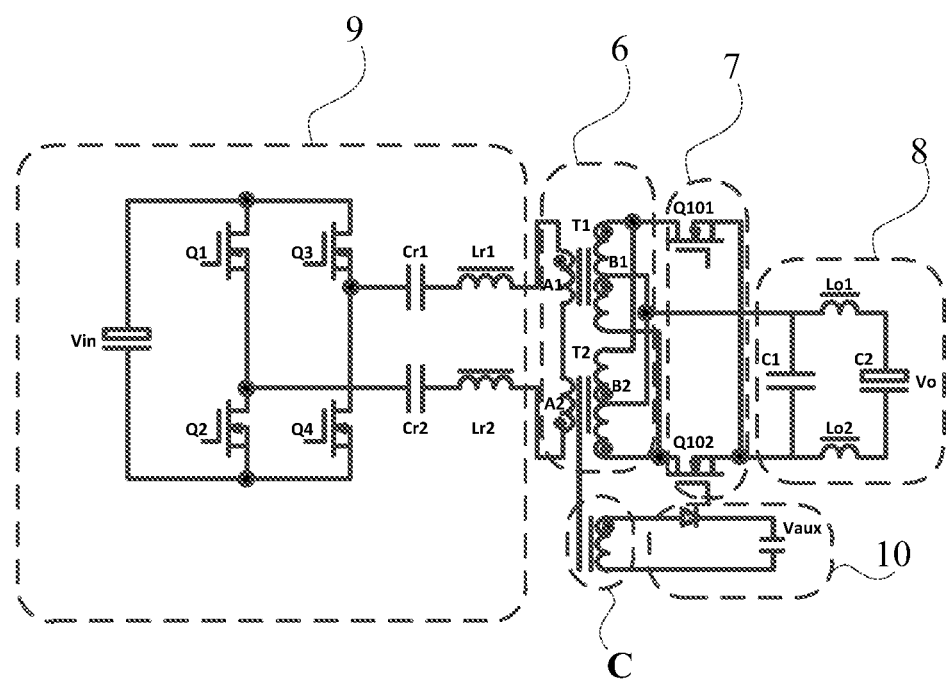
FIG. 6 is a circuit schematic diagram of a power converter provided according to another embodiment of the present disclosure.

FIG. 6 is a schematic circuit diagram of a power converter provided according to another embodiment. As shown in FIG. 6, in some embodiments, at least one auxiliary winding C and one auxiliary power circuit 10 may be integrated on the PWB 2. An output end of the auxiliary winding C is electrically connected to the auxiliary power circuit 10, and the auxiliary power circuit 10 converts electric energy (including voltage and current) output from the auxiliary winding C into the required voltage and current that can provide auxiliary power supply for a control circuit and the like in the power converter.

With the integrated transformer of the above embodiment of the present disclosure, an insulation voltage between the first winding A1 and the second winding B1 can be equal to or greater than 5 KVac, and the insulation voltage between the third winding A2 and the fourth winding B2 can be equal to or greater than 5 KVac. In the integrated transformer provided by the embodiment of the present disclosure, the first winding A1 of the first transformer T1 and the third winding A2 of the second transformer T2 are respectively wound on the first winding column 11 and the second winding column 12 that are disposed adjacently, the second winding B1 of the first transformer T1 and the fourth winding B2 of the second transformer T2 are disposed on the PWB 2, and the winding directions of all windings are reasonably set so that the magnetic flux directions inside the two adjacent winding columns are opposite, thereby integrating the two transformers into one magnetic element and then achieving an increase in the insulation withstand voltage and the power efficiency while reducing the overall volume of the transformer. Moreover, with the technical solution of the present disclosure, more than two transformers can be integrated to achieve the same technical effect.

The magnetic core 1 is set as two oppositely disposed magnetic sub-cores, the PWB 2 is located between the two magnetic sub-cores, the two sub-windings on the primary side of each transformer are wound on two oppositely disposed sub-winding columns respectively, the secondary windings are set at corresponding positions on the PWB 2, and the primary and secondary windings use a sandwich winding method, thereby further reducing leakage inductance.

There is a certain heat dissipation gap between each bobbin and the magnetic core 1, and between each bobbin and the PWB 2, so that the integrated transformer dissipates heat faster, thereby optimizing a heat dissipation condition.

The primary windings of the two transformers are wound on the two bobbins of the sub-cores in the form of a continuous wire, and one connection pin is reduced from each magnetic sub-core, thereby further optimizing the structure of the integrated transformer. The secondary windings, the rectifying unit 7 and the filtering unit 8 are all integrated on the same PWB 2, so that alternating current loss of the integrated transformer is reduced and the efficiency of the integrated transformer is improved.

An embodiment of the present disclosure further provides a power converter, which includes a magnetic component, a primary circuit and a secondary circuit, where the magnetic component includes a primary winding and a secondary winding, the primary circuit is electrically coupled to the primary winding of the magnetic component, and the secondary circuit is electrically coupled to the secondary winding of the magnetic component; and the magnetic component is configured as the integrated transformer in the above-described embodiments. The first winding A1 and the third winding A2, and the second winding B1 and the fourth winding B2, respectively form the primary windings and the secondary windings of the magnetic component. For example, the first winding A1 and the third winding A2 may be used as the primary winding, and the second winding B1 and the fourth winding B2 may be used as the secondary winding, or the second winding B1 and the fourth winding B2 may be used as the primary winding, and the first winding A1 and the third winding A2 may be used as the secondary winding. The primary circuit is configured to convert an input voltage to the primary voltage and output it to the primary winding of the integrated transformer. The secondary circuit is configured to convert the voltage of the secondary winding of the integrated transformer and output to a load. Further, the secondary circuit includes a rectifying unit and a filtering unit, where the rectifying unit is electrically connected to the secondary winding of the integrated transformer, and the filtering unit is electrically connected to the rectifying unit.

Specifically, as shown in FIGS. 3 to 5, the power converter includes a primary circuit 9, a main power transformer 6, a rectifying unit 7 and a filtering unit 8. The main power transformer 6 is configured as the integrated transformer in the above embodiments. The primary circuit 9 is a full-bridge circuit topology, which is configured to receive an input voltage Vin and convert the input voltage Vin into the primary voltage and output it to the primary winding of the main power transformer 6. That is, a first output of the primary circuit 9 is electrically connected to one end of the first winding A1 of the main power transformer 6, the other end of the first winding A1 is electrically connected to one end of the third winding A2, and the other end of the third winding A2 is electrically connected to a second output end of the primary circuit 9. In some other embodiments, the primary circuit 9 may also adopt a half-bridge circuit or other circuit topologies, which is not limited by the present disclosure.

The secondary side of the main power transformer 6 is electrically coupled to the rectifying unit 7 and the filtering unit 8 in sequence, and is configured to convert the voltage of the secondary side of the main power transformer 6 to an output voltage Vo.

The power converter provided by the embodiment of the present disclosure uses the above-mentioned integrated transformer, and thus has a smaller volume and can achieve a higher level of insulation withstand voltage at a same power efficiency.

In the description of the present disclosure, it should be understood that the terms "first" and "second" are used for description purposes only, and cannot be understood as indicating or implying relative importance or implicitly indicating the number of technical features indicated. Thus, the features defined as "first" and "second" may explicitly or implicitly include one or more of the features. In the description of the present disclosure, the meaning of "plurality" is at least two, such as two, three, etc., unless specifically defined otherwise.

In the present disclosure, unless otherwise clearly specified and limited, the terms "installation", "connected with", "connected to", "fixed", etc. should be understood in a broad sense, for example, it may be a fixed connection or a detachable connection, or be integrated; it may be a mechanical connection, an electrical connection, or may be communications with each other; and it may be a direct connection or indirect connection through an intermediary, and may be an internal communication of the two components or interaction between the two components. Those of ordinary skill in the art can understand the specific meanings of the above terms in the present disclosure according to specific situations.

In the present disclosure, unless otherwise clearly specified and defined, a first feature "above" or "below" a second feature may include direct contact between the first and second features, or may include that the first and second features are not in direct contact but are in contact with another feature between them. Moreover, a first feature is "on", "above" and "over" a second feature includes that the first feature is directly above and obliquely above the second feature, or simply means that the first feature is higher in horizontal level than the second feature. A first feature is "under", "below" and "down" a second feature includes that the first feature is directly below and obliquely below the second feature, or simply means that the first feature is lower in horizontal level than the second feature.

Those skilled in the art will easily think of other embodiments of the present disclosure after considering the description and practicing the disclosure disclosed herein. The present disclosure is intended to cover any variations, uses, or adaptive changes of the present disclosure that follow the general principles of the present disclosure and include common general knowledge or common technical means in the art that are not disclosed in the present disclosure. The description and examples are to be considered illustratively only, and the true scope and spirit of this disclosure are pointed out by the following claims.

It should be understood that the present disclosure is not limited to the precise structure that has been described above and shown in the drawings, and various modifications and changes can be made without departing from the scope thereof. The scope of the present disclosure is limited only by the appended claims.

What is claimed is:

1. An integrated transformer, comprising:
    a magnetic core, comprising an upper cover, a lower cover, a first winding column and a second winding column, wherein the first winding column and the second winding column are disposed adjacently and are located between the upper cover and the lower cover;
    a printed wiring board, disposed between the upper cover and the lower cover, wherein the printed wiring board comprises a first through hole and a second through hole, the first through hole corresponds to the first winding column, and the second through hole corresponds to the second winding column;
    a first winding, wound on the first winding column;
    a second winding, provided in the printed wiring board and corresponding to the first through hole;
    a third winding, wound on the second winding column; and
    a fourth winding, provided in the printed wiring board and corresponding to the second through hole,
    wherein magnetic flux directions inside the first winding column and the second winding column are opposite.

2. The integrated transformer according to claim 1, wherein the first winding and the third winding are electrically connected in series.

3. The integrated transformer according to claim 2, wherein the second winding and the fourth winding are electrically connected in series or in parallel.

4. The integrated transformer according to claim 1, wherein
    the first winding comprises a first sub-winding and a second sub-winding, and the first sub-winding and the second sub-winding are respectively located on two sides of a plane where the printed wiring board is located; and the third winding comprises a third sub-winding and a fourth sub-winding, and the third sub-winding and the fourth sub-winding are respectively located on the two sides of the plane where the printed wiring board is located.

5. The integrated transformer according to claim 4, wherein the first sub-winding and the second sub-winding are electrically connected in series or in parallel.

6. The integrated transformer according to claim 4, wherein the third sub-winding and the fourth sub-winding are electrically connected in series or in parallel.

7. The integrated transformer according to claim 4, wherein the first sub-winding and the third sub-winding are continuously wound on the first winding column and the second winding column using a same winding wire, and winding directions of the first sub-winding and the third sub-winding are opposite.

8. The integrated transformer according to claim 4, wherein two first sub-winding columns corresponding to the first through hole are respectively provided on the upper cover and the lower cover, two second sub-winding columns corresponding to the second through hole are respectively provided on the upper cover and the lower cover, the two first sub-winding columns are oppositely disposed to form the first winding column, and the two second sub-winding columns are oppositely disposed to form the second winding column.

9. The integrated transformer according to claim 8, wherein the first sub-winding and the second sub-winding are respectively wound on the two first sub-winding columns that are oppositely disposed, and the third sub-winding and the fourth sub-winding are respectively wound on the two second sub-winding columns that are oppositely disposed.

10. The integrated transformer according to claim 4, wherein the integrated transformer further comprises a first bobbin, a second bobbin, a third bobbin and a fourth bobbin, wherein the first bobbin and the second bobbin are respectively located on two sides of the printed wiring board and correspond to the first winding column, and the third bobbin and the fourth bobbin are respectively located on the two sides of the printed wiring board and correspond to the second winding column.

11. The integrated transformer according to claim 10, wherein for each bobbin of the first bobbin, the second bobbin, the third bobbin, and the fourth bobbin, a heat dissipation gap is provided between the each bobbin and the magnetic core or provided between the each bobbin and the printed wiring board.

12. The integrated transformer according to claim 1, wherein an insulating sheet is provided between the printed wiring board and the first winding, and provided between the printed wiring board and the third winding.

13. The integrated transformer according to claim 1, wherein a circuit module electrically connected to the second winding and the fourth winding is integrated on the printed wiring board, and the circuit module comprises a rectifying unit and/or a filtering unit.

14. The integrated transformer according to claim 1, wherein at least one auxiliary winding and one auxiliary power circuit is provided on the printed wiring board, and an output end of the auxiliary winding is electrically connected to the auxiliary power circuit.

15. The integrated transformer according to claim 1, wherein the first winding and the third winding are configured as primary windings of the integrated transformer, and the second winding and the fourth winding are configured as secondary windings of the integrated transformer.

16. The integrated transformer according to claim 3, wherein the first winding and the third winding are configured as primary windings of the integrated transformer, and the second winding and the fourth winding are configured as secondary windings of the integrated transformer.

17. The integrated transformer according to claim 15, wherein
the first winding and the second winding form the primary and secondary windings of a first transformer in the integrated transformer; and
the third winding and the fourth winding form the primary and secondary windings of a second transformer in the integrated transformer.

18. The integrated transformer according to claim 1, wherein an insulation voltage between the first winding and the second winding is greater than or equal to 5 KVac, and an insulation voltage between the third winding and the fourth winding is greater than or equal to 5 KVac.

19. A power converter, comprising:
a magnetic component, comprising a primary winding and a secondary winding;
a primary circuit, electrically connected to the primary winding of the magnetic component; and
a secondary circuit, electrically connected to the secondary winding of the magnetic component,
wherein the magnetic component is configured as the integrated transformer as claimed in claim 1, the first winding and the third winding form the primary winding of the magnetic component, and the second winding and the fourth winding form the secondary winding of the magnetic component.

20. The power converter according to claim 19, wherein the secondary circuit comprises a rectifying unit and a filtering unit, wherein the rectifying unit is electrically connected between the secondary winding and the filtering unit.

* * * * *